United States Patent [19]

Berger

[11] 4,430,672

[45] Feb. 7, 1984

[54] PHOTOSENSITIVE DEVICE READ BY CHARGE TRANSFER

[75] Inventor: Jean Luc Berger, Paris, France

[73] Assignee: Thomson CSF, Paris, France

[21] Appl. No.: 237,996

[22] Filed: Feb. 5, 1981

[30] Foreign Application Priority Data

Apr. 23, 1980 [FR] France ................................ 80 09112

[51] Int. Cl.$^3$ .............................................. H04N 3/14
[52] U.S. Cl. .................................................... 358/213
[58] Field of Search ......................................... 358/213

[56] References Cited

U.S. PATENT DOCUMENTS 4,335,405 6/1982 Sakane et al. ...................... 358/213

FOREIGN PATENT DOCUMENTS 2606108 8/1977 Fed. Rep. of Germany .
2314584 7/1977 France .
2367353 5/1978 France .
2376517 7/1978 France .

OTHER PUBLICATIONS

IEEE Journal of Solid State Circuits, vol. SC-14, No. 3, Jun. 1979, (N.Y.), R. Koch: "Charge-injection device with CCD readout", pp. 604–608.

Primary Examiner—Richard Murray
Attorney, Agent, or Firm—Roland Plottel

[57] ABSTRACT

This device incorporates a photosensitive (1) constituted by a matrix of photosensitive points. Each photosensitive point has a charge reading diode $D_1$. Metallic connections ($C_1$ to $C_4$) connect the reading diodes of the same column to a single diode ($D_2$), followed by a grid $G_2$ raised to a constant potential ($V_2$). The operation of the device involves the repetition of two stages, i.e. stage $T_1$ and stage $T_2$. During stage $T_1$ parasitic charges, due for example to too intense illumination, are transferred from diodes $D_1$ to diodes $D_2$ and are removed by a diode ($D_5$). During stage $T_2$ the signal charges stored by the points of one line of the matrix are transferred into a memory and then into a charge transfer read register ($R_2$). The register reads these charges during the following stages $T_1$ and $T_2$ until the time when the register receives the charges corresponding to the reading of the following line.

35 Claims, 32 Drawing Figures

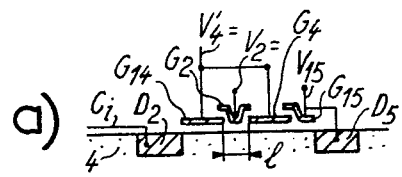
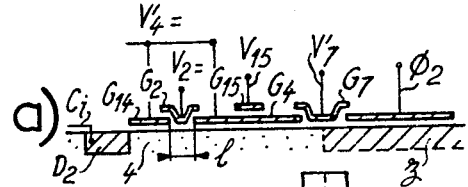
FIG. 8    FIG. 9
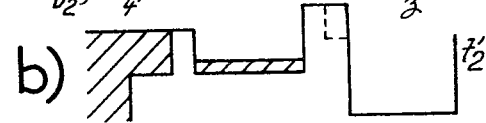
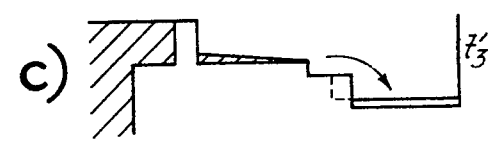
FIG. 10
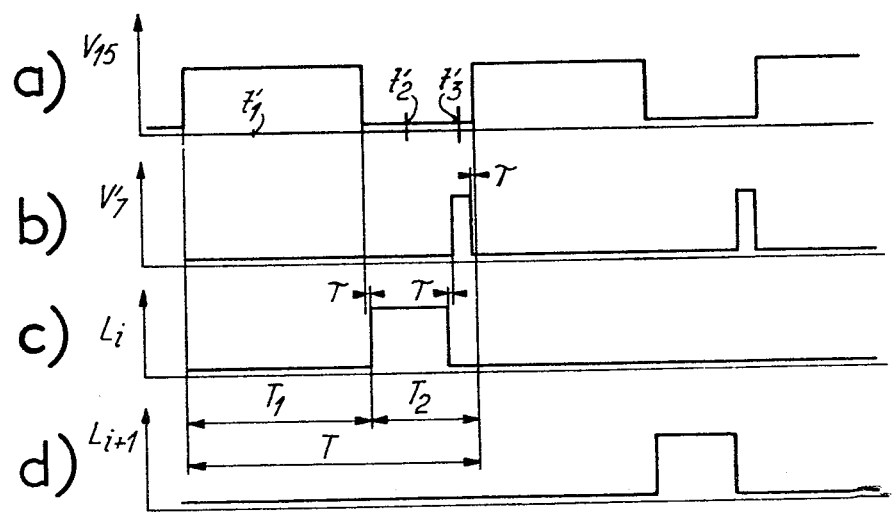

PHOTOSENSITIVE DEVICE READ BY CHARGE TRANSFER

BACKGROUND OF THE INVENTION

The present invention relates to a photosensitive device read by charge transfer. It also relates to a television camera incorporating such a device.

The prior art, particularly the work by C. H. SEQUIN and M. F. TOMPSETT entitled "Charge transfer devices", pages 152 to 169 mainly describes two types of photosensitive device using charge transfers. In the first type of photosensitive charge transfer device light radiation is transmitted to charge transfer registers. There are numerous possible organizations of the registers exposed to the radiation and the charge transfer registers used for storing the charges after reading. The most frequently encountered organizations are of the "field or frame transfer type" or "the interline structure type". These devices have the disadvantage of requiring large charge transfer device surfaces, it being difficult at present to obtain high efficiency levels for the production of such large surfaces. The second type of photosensitive device is of the charge injection device-type or C.I.D. and does not suffer from the aforementioned disadvantage. These devices have a matrix of photosensitive points constituted by two MOS capacitors connected by a grid. One of the capacitors is exposed to the light radiation. The charges induced beneath this capacitor are periodically transferred to the adjacent capacitor and the charges are read by an MOS transistor. Two digital shift registers permit the addressing of each point with a view to the reading thereof. The capacitors of the same line which are exposed to the radiation are connected in parallel and addressed by one of the registers, whilst the capacitors of the same column used for reading are connected in parallel and addressed by the other register. The charge injection device have the disadvantage of requiring a re-injection of the charges into the semiconductor substrate where the capacitors are integrated during or after the reading of the charges. This re-injection requires the use of substrates which have undergone epitaxy or collecting diffusions in order to be effective. It is also difficult to control and can lead to remanence if it is incomplete. Moreover, in charge injection devices the charges are read over a high capacitance, which reduces the signal/noise ratio and said capacitance is dependent on the number of lines.

Furthermore, the article which appeared in the I.E.E.E. Journal of Solid-State Circuits, vol. SC 14, no. 3, June 1979, pp. 604 to 608 disclosed a photosensitive device having a C.I.D.-type matrix read by charge transfer (cf. in particular FIGS. 7 and 8 of the article and the comments thereon). In this device the reading capacitors are addressed by a C.C.D. (Charge Coupled Device) shift register. Each line of the matrix is read in two stages. In the first stage the potential of all the reading capacitors is fixed. There is a transverse transfer of charges into the C.C.D. register and removal of said charges by MOS transistors $TG_2$. In the second stage the transfer of charges beneath the reading capacitors leads to the injection into the C.C.D. register of signal charges which are read in series by longitudinal transfer.

The charge transfer is of the "Bucket Brigade" type, i.e. it is carried out by means of the analog of a suturation-polarized MOS transistor.

A disadvantage of this device is that, to be effective, the transfer requires a relatively long time. However, for this device to be usable by a television camera, the first stage and also the second up to the injection of the signal charges into the C.C.D. register must take place during the line return time, which is only 12 $\mu$s in the 625 line standard. During the line reading time the charges injected into the C.C.D. register are read in series and there is a re-injection of charges into the semiconductor substrate. However, an advantage of this device compared with the conventional C.I.D. devices is that the reading of the charges no longer takes place over a high capacitance and is no longer dependent on the number of lines.

BRIEF SUMMARY OF THE INVENTION

The present invention relates to a photosensitive device read by charge transfer having numerous advantages compared with the prior art devices.

The device according to the present invention has:
n lines of m photosensitive points, each photosensitive point being constituted by the integration on a semiconductor substrate of an MOS capacitor ($C_0$), having a grid $G_0$ common to the points of the same line and a reading diode $D_1$ separated from grid $G_0$ by a screen grid $G_1$ raised to a constant potential ($V_1$), m metallic connections ($C_1 \ldots C_m$) connecting in parallel n diodes belonging to different lines;
m diodes $D_2$ integrated on to the same semiconductor substrate to which lead the m metallic connections, said diodes being followed by a grid $G_2$ raised to a constant potential ($V_2$);
removing means on a diode ($D_5$) of the charges accumulated on diodes $D_1$ and $D_2$ during each time interval when none of the grids $G_0$ is at zero;
at least one shift register ($R_1$) making it possible to periodically zero each grid $G_0$ and remove the signal charges on diodes $D_1$, and diodes $D_2$;
means ensuring the transfer of the signal charges arriving beneath diodes $D_2$ to a charge transfer read register $R_2$ with m parallel inputs and a series output.

According to a preferred embodiment the device according to the invention has an integrated memory on the semiconductor substrate following the sequence of diodes $D_2$ and beneath which the signal charges are collected before being transferred into the read register $R_2$.

The most important advantages of the invention are described hereinafter. Due to the fact that simultaneously with the reading of the signal charges they are removed from the photosensitive area of the device by transfer of said charges from the reading diodes $D_1$ to diodes $D_2$ across metallic connections $C_1 \ldots C_n$ there is no longer any need, as in the conventional C.I.D. devices or in the case of the C.I.D. device of the article in I.E.E.E. referred to hereinbefore to re-inject the charges into the substrate. In addition, the reading diodes $D_1$ also fulfil an anti-blooming function. Thus, when a photosensitive point is too intensely illuminated, the storage capacitance $C_0$ of these charges for this point overflows into the adjacent diode $D_1$ and between two readings of a line (stage $T_2$) the charges which have overflowed into diodes $D_1$ are removed (stage $T_1$). Moreover, n diodes $D_1$ are connected in parallel by each connection $C_i$, the charges due to the excessive illumination can be distributed over n diodes before overflowing into the substrate. The diodes $D_1$, ensuring both the removal of the charges from the photosensitive part and the anit-blooming function make it possible to obviate the use of horizontal collecting diffusions and vertical electrodes serving to isolate the cells from one another as is generally the case in C.I.D. devices (cf. the guard stripes and field shield electrodes in FIGS. 2, 3 and 4 of the I.E.E.E. document referred to hereinbefore, and the comments on these drawings). In addition, the device according to the invention generally has a memory where the charges corresponding to the reading of a line of photosensitive points are temporarily stored before being transferred into the charge transfer read register. In the device according to the invention, like that described in the I.E.E.E. article, the transfer of charges from each line to the read register is of the "Bucket Brigade" type. Through adding a memory there is a time equal to that of a line reading (i.e. 52 $\mu$s for the 625 line TV standard) for carrying out the removal of parasitic charges on diodes $D_1$ and $D_2$ and the transfer of a line into the memory, whereas in the device described in the I.E.E.E. article these times are reduced to the line return time (12 $\mu$s).

BRIEF DESCRIPTION OF THE DRAWINGS

The invention is described in greater detail hereinafter relative to non-limitative embodiments and the attached drawings, wherein show:

FIGS. 8a and 9a two cross-sectional views of the embodiment of FIG. 7 and FIGS. 8b, 8c and 9b, 9c diagrams illustrating the operation of this embodiment.

FIGS. 10a to 10d control signals which can be applied to the device according to the invention.

DETAILED DESCRIPTION OF THE PREFERRED EMBODIMENTS

In the various drawings the same references designate the same components but, for reasons of clarity, the dimensions and proportions of these components have not been respected.

Figure 1:
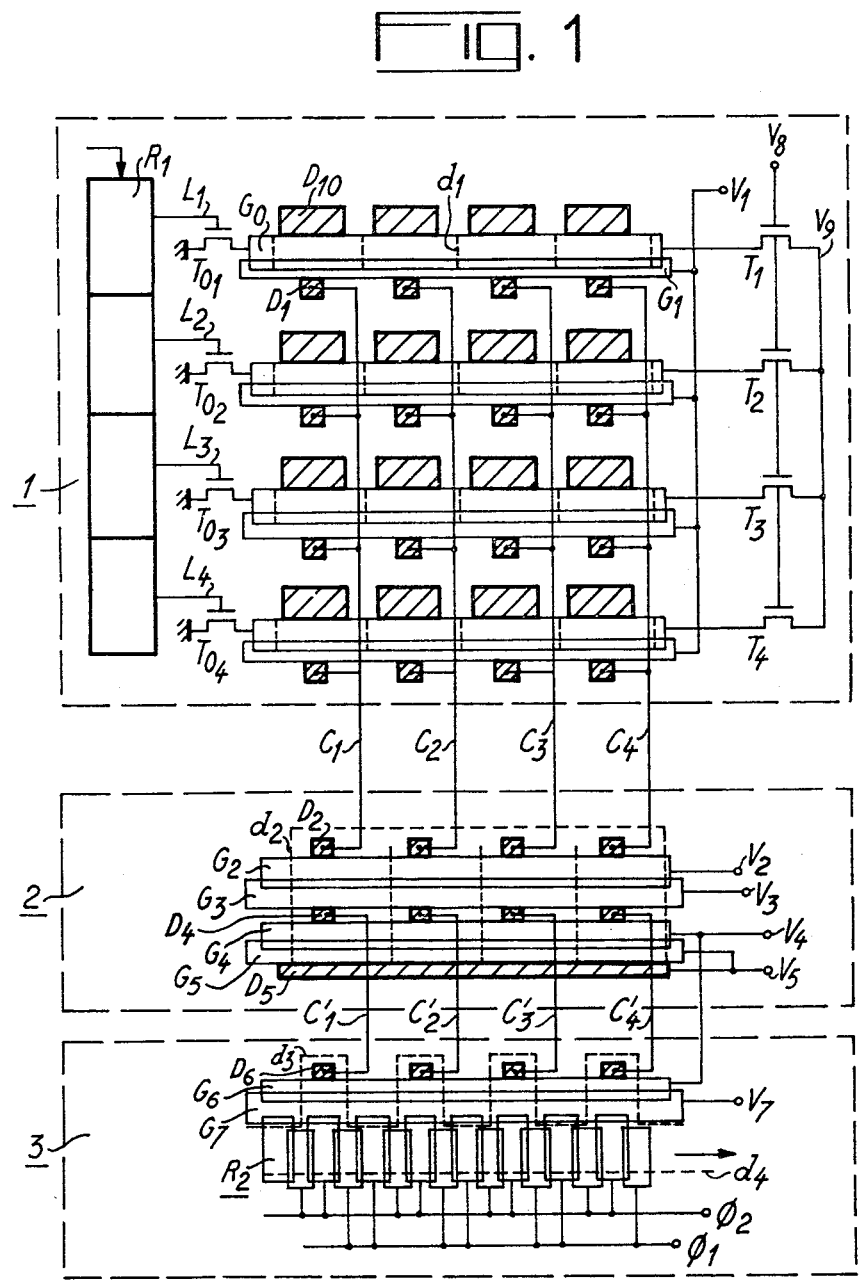
FIG. 1 a diagrammatic plan view of an embodiment of the device according to the invention.
Figure 2:
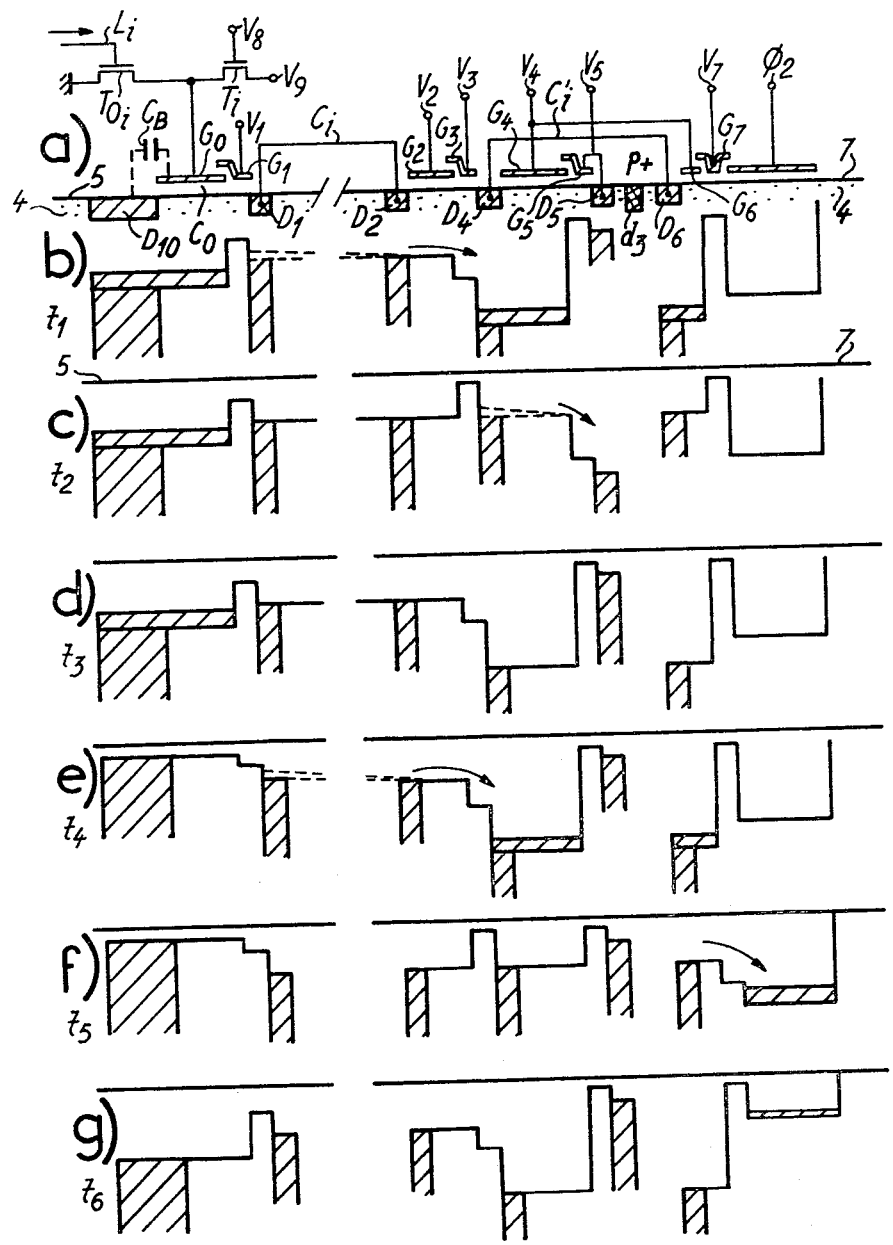
FIG. 2a a longitudinal sectional view of the device of FIG. 1 and FIGS. 2b to 2g diagrams illustrating the operation of the device.

FIG. 1 is a diagrammatic plan view of an embodiment of the device according to the invention. FIG. 2a is a longitudinal sectional view of the device of FIG. 1.

The photosensitive device according to the invention essentially comprises three parts, namely a photosensitive area 1, a memory and parasitic charge transfer device 2 and a read register 3. Each of these parts will be successively described, as will the manner of their interconnection.

The photosensitive area 1 has a matrix of photosensitive points. In FIG. 1 this matrix comprises four lines and four columns and therefore sixteen photosensitive points. Each photosensitive point is constituted by the integration on a semiconductor substrate 4, which is generally of silicon of:

An MOS capacitor of capacitance $C_0$ constituted by a horizontal grid $G_0$ common to the points of the same line.

Vertical isolating diffusions $D_1$ on each grid $G_0$ determine the capacitance $C_0$ of each photosensitive point.

A collecting diode $D_{10}$ which is sensitive to the limited wavelengths to which the grids $G_0$ are opaque. The diodes $D_{10}$ are locally diffused in the vicinity of grids $G_0$, said diodes being arranged in matrix form. In FIG. 1 each line of diodes $D_{10}$ is arranged along the edge of one of the large sides of one of the grids $G_0$, which are rectangular.

A screen grid $G_1$ which is raised to a constant potential $V_1$. In FIG. 1 grid $G_1$ is horizontal and common to all the photosensitive points of the same line. Like grid $G_0$ grid $G_1$ is rectangular and borders the other large side of $G_0$, which is not occupied by diodes $D_{10}$.

A reading diode $D_1$. The reading diodes $D_1$ are arranged in matrix form and four vertical metallic connections $C_1$ to $C_4$, which are generally of aluminium, connect the four reading diodes $D_1$ of the same column in parallel.

The collecting diodes $D_{10}$ must be strongly coupled to grids $G_0$ by edge capacitances $C_B$, which are high compared with the capacitances $C_{D10}$ of diodes $D_{10}$ to the semiconductor substrate 4. It is necessary to have: $C_B >> C_{D10}$. For this purpose the common perimeter between each diode $D_{10}$ and the adjacent grid $G_0$ is increased to the maximum. Thus, the potential of diodes $D_{10}$ precisely follows the surface potential beneath the adjacent grid $G_0$. Diodes $D_{10}$ could also be positioned between grids $G_0$ and $G_1$.

The diffusion zone corresponding to each diode $D_{10}$ could also be extended under the adjacent grid $G_0$. It allows to increase the coupling between the collecting diodes $D_{10}$ and the grids $G_0$: so, the removing of the parasitic charges is realized easier by each photosensitive point; moreover, it increases the quantity of charges stored by each photosensitive point for a given potential variation on the grid $G_0$.

Grids $G_0$ receive two types of polarization.

On the one hand all the grids $G_0$ of the photosensitive area are exposed to a constant potential $V_9$ permitting the integration of the charges at each photosensitive point as a function of the illuminations received by this point. Each grid $G_0$ is connected to one of the electrodes of an MOS transistor $T_1$ to $T_4$, whose other electrode is connected to the d.c. voltage $V_9$ and whose grid receives a potential $V_8$ making it possible to restore the potential $V_9$ on all the grids $G_0$. Potential $V_8$ can be a d.c. voltage or a voltage varying as a function of time. In the case where $V_8$ is a d.c. voltage, potential $V_9$ is restored on grid $G_0$, which was previously at zero, with a relatively long time constant and the value of the storage capacity of charges $C_0$ increases with time. This reduces the quantity of charges collected by heat generation. In the case where potential $V_8$ is a signal variable as a function of time, it is generally the passage of $V_8$ to the high level which renders transistors $T_1$ to $T_4$ conductive and instantaneously restores potential $V_9$ on all the grids $G_0$.

On the other hand each grid $G_0$ periodically receives a zero potential, which leads to the signal charges stored under said grid being transferred beneath diodes $D_1$, whilst the other grids $G_0$ are kept at potential $V_9$ and charge integration continues under these grids. In order to periodically zero one of the grids $G_0$, each grid $G_0$ is connected to one of the electrodes of an MOS transistor $T_{01}$ to $T_{04}$, whose other electrode is connected to earth and whose grid receives the control signals $L_1$ to $L_4$ from four successive stages of a shift register $R_1$. When one control signal $L_i$ passes to high level one of the grids $G_0$ is zeroed.

Reference will now be made to the memory and the parasitic charge removal device 2, which are generally integrated on to the same semiconductor substrate as that into which is integrated the photosensitive area 1. The connection between parts 1 and 2 of the photosensitive device according to the invention is ensured by four diodes $D_2$ which are integrated on to the semiconductor substrate 4 and to which lead the metallic connections $C_1$ to $C_4$. Diodes $D_2$ are followed by a horizontal grid $G_2$ common to all the diodes and which is raised to a constant potential $V_2$. Grid $G_2$ fixes at $V_2-V_T$ the potential on diodes $D_2$ and on the reading diodes $D_1$ connected to diodes $D_2$, $V_T$ representing the threshold voltage beneath grid $G_2$.

Grid $G_2$, which is connected to constant potential $V_2$, as well as grids $G_1$ connected to constant potential $V_1$ prevent the transmission of interference on connections $C_1$ to $C_4$, which would have the effect of introducing into the memory parasitic or spurious charges superimposed on the signal charges. In charge transfer devices it is particularly important to protect against parasitic charges, whose amplitude can vary from one point to another in the circuit as a function of geometrical variations of the components and which limit the dynamics of the signal.

Moreover, grids $G_1$ isolate the photosensitive area 1 from interference from connections $C_i$ and from part 2 of the device and in the same way grid $G_2$ isolates part 2 from interference from connections $C_i$ and part 1.

Grid $G_2$ is followed by a grid $G_3$ and like the former is horizontal and singular. Grid $G_3$ is controlled by a periodic signal $V_3$. The passage of $V_3$ from a high level to a low level makes it possible to prevent the rearward return of charges transferred from diodes $D_1$ and $D_2$ to the memory.

The memory is formed by four aligned diodes $D_4$, which are followed by a single horizontal grid $G_4$ raised to a variable potential $V_4$. Two types of charge are successively stored in this memory, namely parasitic charges accumulated beneath diodes $D_1$ and $D_2$ during each time interval when none of the grids $G_0$ is at zero and signal charges resulting from the zeroing of the grid $G_0$.

The memory is followed by a parasitic charge removal device constituted by a single, horizontal grid $G_5$, followed by a single diode $D_5$. Grid $G_5$ and diode $D_5$ are connected to a variable potential $V_5$.

On semiconductor substrate 4 isolating diffusions $d_2$ delimit in per se known manner the area of the substrate which is reserved for the processing of charges from each column of photosensitive points and isolate diodes $D_2$ from diodes $D_1$.

The third part of the photosensitive device according to the invention will now be described, i.e. the read register 3.

The read register 3 is generally integrated into the same semiconductor substrate 4 as the memory and the parasitic charge removal device. However, it is isolated therefrom by a slotted isolating diffusion area $d_3$.

Within the slots there are four aligned diodes $D_6$ connected by metallic connections $C'_1$ to $C'_4$ to the four diodes $D_4$ of the memory. In this way the signal charges are transferred from the memory to the read register. Diodes $D_6$ are followed by a single, horizontal grid $G_6$ connected to the same variable potential $V_4$ as the memory grid $G_4$. Grid $G_6$ is followed by a single, horizontal grid $G_7$ connected to a variable potential $V_7$ and which permits during its passage to high level the transfer of signal charges to the actual read register $R_2$.

In FIG. 1 read register $R_2$ is a C.C.D. register with two phases $\emptyset 1$ and $\emptyset 2$. This register has a succession of storage electrodes and charge transfer electrodes arranged over an extra insulant thickness with respect to the storage electrodes. Every other storage electrode leads to the lower end of the slotted isolating diffusion area $d_3$ and consequently receives no charges. Charges are transferred horizontally into register $R_2$, as indicated by the arrow in FIG. 1. Thus, the signal charges of one line of photosensitive elements are read in series. An isolating diffusion $d_4$ determines the lower limit of the channel transferring the charges into register $R_2$.

It is as a result of the presence of the parasitic charge removal device that the connection between the memory and the read register 3 must be by means of connections outside substrate $C'_1$ to $C'_4$. In the same way as for diodes $D_{10}$ and grid $G_0$, there must be a good coupling between diodes $D_4$ and grid $G_4$, as well as between diodes $D_6$ and grid $G_6$. Thus, each diode and part of the adjacent grid can be covered by an insulating layer and then by an aluminium layer. An electrical contact is then made through the insulant level with each grid.

The above description relates to the case of a matrix having four lines and four photosensitive columns. However, it is obvious that the description also applies to the case where the matrix has n lines of m photosensitive points, where n and m are positive integers.

The operation of the device according to the invention shown in FIGS. 1 and 2a will now be explained by describing FIGS. 2b to 2g. FIGS. 2b to 2g represent the evolution of the surface potential $\emptyset_S$ in the semiconductor substrate 4 at various times $t_1$ and $t_6$. The hached areas indicate the presence of minority carriers. FIGS. 2b to 2g only show the interface 5 and 7 of substrate 4 and the insulating layer covering them.

Times $t_1$ to $t_6$ are marked on FIGS. 4a to 4f, which represent the control signals liable to be applied to the device according to the invention. These control signals are periodic signals, whose amplitude varies between a low level and a high level.

Figure 4:
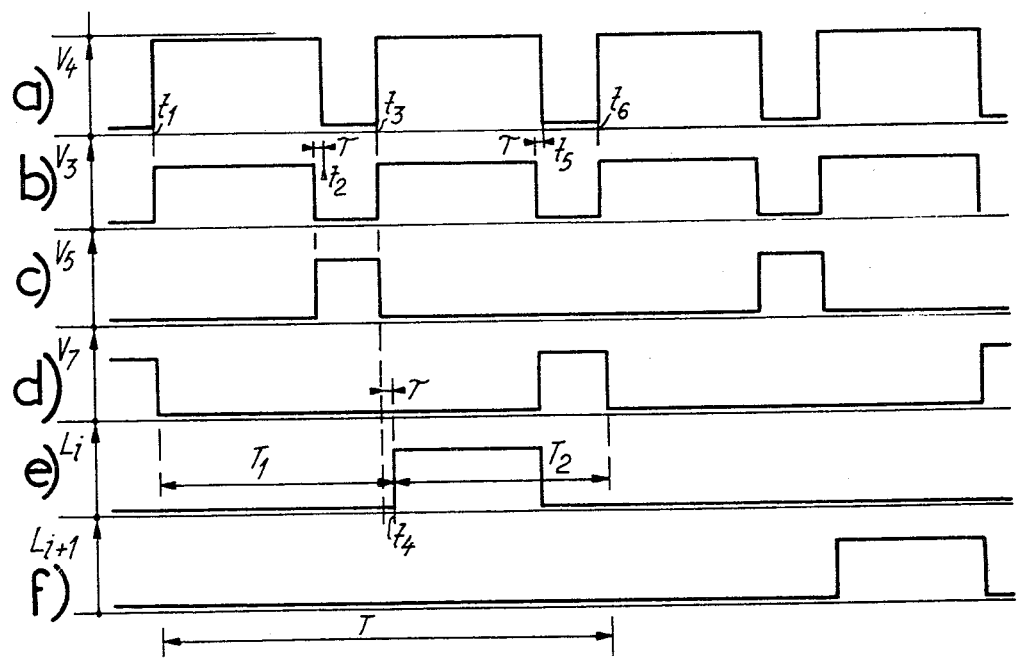
FIG. 4 control signals which can be applied to the device according to the invention.

FIGS. 4a and 4b show signals $V_4$ and $V_3$ of the same period $2^T$. Signal $V_3$ returns to low level a very short time $\tau$ before $V_4$.

FIGS. 4c and 4d show signals $V_5$ and $V_7$ of the same period T. Signals $V_5$ and $V_7$ are in phase opposition with $V_3$. FIGS. 4e and 4f show signals $L_i$ and $L_{i+1}$, which are of the same period nT. They pass to high level a very short time $\tau$ after $V_3$ passes to high level and return to low level at the same time as $V_3$.

The operation of the device according to the invention involves the repetition of two separate stages of duration $T_1$ and $T_2$, which will be designated hereinafter by stage $T_1$ and stage $T_2$, the sum of $T_1$ and $T_2$ being equal to T.

During stage $T_1$ all the grids $G_0$ are raised to the potential $V_9$. The parasitic charges on all the diodes $D_1$ and $D_2$ are transferred to the memory and then to the parasitic charge removal device.

During stage $T_2$ only one of the grids $G_0$ of the photosensitive area is at potential 0, whilst the other grids $G_0$ are at potential $V_9$. The signal charges stored beneath the grid at potential 0 are transferred to diodes $D_1$ and $D_2$, then beneath the memory, before being transferred into the read register $R_2$ where they will be read during the following stage $T_1$.

The stages $T_1$ and $T_2$ will now be studied in detail.

Stage $T_1$

At time $t_1$ only signals $V_3$ and $V_4$ are at high level. All the grids $G_0$ are at potential $V_9$ and integration of the charges continues in each capacitor $C_0$ and on each diode $D_{10}$. The parasitic charges detected by diodes $D_1$ and $D_2$ in all the device are removed into the memory, this being made possible by grid $C_3$ which is at high level. These parasitic charges essentially result from an overflow of capacitors $C_0$ due to a too intense lighting. This is the anti-blooming function of diodes $D_1$. The parasitic charges can also be charges collected laterally by diodes $D_1$ and $D_2$.

At time $t_2-\tau$ signal $V_3$ returns to zero and grid $G_3$ then isolates the memory from the photosensitive area. At time $t_2-\tau$ signal $V_5$ also passes to high level and grid $G_5$ and diode $D_5$ are ready to receive the parasitic charges.

At time $t_2$ signal $V_4$ returns to zero and the parasitic charges distributed in equal manner beneath diode $D_4$, grids $G_4$, diodes $D_6$ and grids $G_6$ are transferred beneath the removal diode $D_5$.

At time $t_3$, as at time $t_1$, only signals $V_3$ and $V_4$ are at high level, this representing the end of stage $T_1$.

Stage $T_2$

At time $t_4$ signals $V_3$, $V_4$ and $L_i$ are at high level. Grid $G_0$ of the photosensitive area, which is connected to MOS transistor $T_{0i}$ controlled by signal $L_i$ is then connected to zero. There is then a transfer of the signal charges stored by all the photosensitive points located beneath grid $G_0$ to diodes $D_1$ and $D_2$ and then into the memory. As in the case of parasitic charge removal, the transfer of charges into the memory takes place at a constant potential $V_2-V_T$ as a result of grid $G_2$. It has been seen hereinbefore that the transfer of charges into the memory, no matter whether they are parasitic charges or signal charges is of the Bucket-Brigade type, i.e. it takes place via the analog of a saturation-polarized MOS transistor, whose source is constituted by diodes $D_1$ and $D_2$, whose grid is constituted by grid $G_2$ raised to constant potential $V_2$ and whose drain is constituted by diode $D_4$ raised by grid $G_4$ to a potential $V_4$ higher than $V_3$. As has been stated hereinbefore to be effective this type of transfer requires a relatively long time. In the device according to the invention the existence of the memory provides a time equal to that of a line read for removing the parasitic charges to all the diodes $D_1$ and $D_2$ and the transfer of a line $L_i$ into the memory.

Thus, during this time register $R_2$ ensures the reading of a preceding line $L_{i-1}$ of the matrix.

At time $t_5-\tau$ with the signal charge transfer into the memory at an end, signals $V_3$ and $L_i$ pass to low level, whilst signal $V_7$ passes to high level. Grid $G_3$ again isolates the connections $C_i$ from the memory. Grid $G_7$ is raised to high level and opens the passage to the read register $R_2$.

At time $t_5$ signal $V_4$ passes to low level and there is a transfer of the signal charges which were distributed beneath diodes $D_4$, $D_6$ and grids $G_4$, $G_6$ into read register $R_2$. The transfer of the signal charges into the read register must take place during the line return time, whereas all the preceding stages from $t_1$ to $t_5-\tau$ take place during the line read time. After time $t_5$ signal $V_8$ restores potential $V_9$ on grid $G_0$, whose content has been transferred to the read register. In the case where signal $V_9$ is a periodic signal, it can be identical to signal $V_7$.

At time $t_6$ the control signals again assume their value at time $t_1$. A new stage $T_1$ starts, whilst line $L_i$ is read by register $R_2$, which continues during stage $T_2$ when the content of the following line $L_{i+1}$ is transferred into the memory and ends at the next time $t_5-\tau$.

The photosensitive device according to the invention can receive the light radiation to be detected either by its front face where grids $G_0$ and $G_1$ are located, or by its rear face. In the case when the light radiation is transmitted to the front face of the device, grids $G_0$ must be photosensitive. They are then made from polycrystalline silicon or a semi-transparent metal. The reading diodes $D_1$ are then entirely covered with an insulating layer and then aluminium in order to prevent parasitic illumination. In the same way the memory, the parasitic charge removal device and the read register are covered with an opaque layer protecting them from light radiation, said layer possibly being a metal coating. In the case when the light radiation is transmitted to the rear face of the photosensitive device, the semiconductor substrate 4 carrying the photosensitive area 1 then has a reduced thickness. The metallic connections $C_1$ to $C_4$ make it possible to position the memory, the parasitic charge removal device and the read register a certain distance from the photosensitive area and on a part of substrate 4 whose thickness has not been reduced. This prevents parasitic illumination of these elements.

Figure 3:
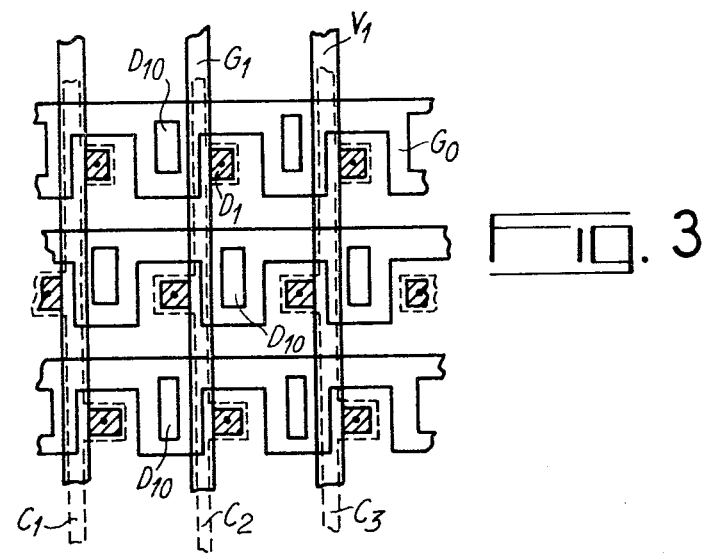
FIG. 3 a diagrammatic plan view of another embodiment of the photosensitive area of the device according to the invention.

FIG. 3 is a diagrammatic plan view of another embodiment of the photosensitive area 1 of the device according to the invention. In this embodiment the photosensitive points are organized so as to be staggered from one line to the next.

Grids $G_0$, formed by a first polycrystalline silicon level are arranged horizontally. The grids are rectangular and have rectangular notches. Each notch contains a reading diode $D_1$. The reading diodes $D_1$ are staggered, because the notches are displaced by a half-pitch from grid $G_0$ to the next.

An opening forming a collecting area $D_{10}$ is placed between two notches on each grid $G_0$. In the case of FIG. 3 where the collecting areas $D_{10}$ are constituted by a single thin oxide area without diffusion and no longer by diodes as is the case in FIG. 1, the carriers created by the photons beneath the collecting areas link the capacitances $C_0$ created by grids $G_0$ by diffusion rather than by conduction. In the case of FIG. 3 each grid $G_0$ receives the carriers generated on each collecting area $D_{10}$ by the complete circumference of said collecting area. The replacement of the diodes by a single thin oxide layer for forming the collecting areas is of interest in the case where the condition $C_B \gg C_{D10}$ cannot be realized.

In this embodiment the grids $G_1$ are formed by a second polycrystalline level and are vertical. Each grid $G_1$ partly covers on the one hand one of the vertical edges of a notch made on each grid $G_0$ and on the other the reading diode $D_1$ located in said notch. The reading diode $D_1$ are thus arranged in alternating manner to the right and left of the vertical electrode $G_1$ from one line to the next.

On grids $G_1$ the aluminium connections $C_i$ are isolated by a thick oxide layer. In FIG. 3 the connections $C_1$, $C_2$, $C_3$ are shown as broken lines. These connections address the reading diodes $D_{10}$ by contacts through the oxide layer.

Arranging the photosensitive points in a staggered manner and no longer in the form of a matrix leads to the advantages that the horizontal resolution of the photosensitive points is increased, the connections $C_i$ are completely protected from any interference by grids $G_1$ raised to constant potential $V_1$ and in addition the gap between the grids made on the same polycrystalline silicon level is not critical. Thus, the short-circuit of two grids $G_0$ only affects two lines of the photosensitive area. For the first line the read signal is the sum of the signals of the two lines. The second line is read like a black line, because it is removed by the previous reading operation. Finally a short-circuit on grids $G_1$ has no effect on the operation of the device.

The pitch of the shift register $R_1$ used for the periodic zeroing of each grid $G_0$ is generally larger than the pitch of grid $G_0$. It is possible to use two registers $R_1$ and $R'_1$, whose pitch is double that of grids $G_0$. The registers are then positioned on either side of the photosensitive area. One of the registers addresses the grids $G_0$ of the even row and the other addresses the grids $G_0$ of the uneven row. Interlacing is facilitated by this organisation, which can be used at the same time as the staggered arrangement. Thus, one of the registers can address the grids $G_0$ of the uneven row and the photosensitive points to the right of connections $C_i$, whilst the other register addresses the grids $G_0$ of the even rows and the photosensitive points to the left of connections $C_i$.

It is apparent from the description of the device of FIG. 1 that the operation involves the repetition of two stages $T_1$ and $T_2$. The anti-blooming function is only performed during stages $T_1$. The surplus charges due to photosensitive points which have been too intensely illuminated and which overflow their reading diode $D_1$ are taken into account during stages $T_2$. The surplus charges due to a photosensitive point which has been too intensely illuminated are distributed over all the diodes $D_1$ connected to the reading diode $D_1$ of said too intensely illuminated point by the same metallic connection $C_i$. Thus, the average signal level on this connection $C_i$ is high. If this point is illuminated with an intensity B times higher than that producing the maximum quantity of charges Q level with a photosensitive point, the average level for the diodes connected to connection $C_i$ is increased by quantity:

$(B/N)\cdot(T_1/T)\cdot Q$, in which N represents the number of grids $G_O$ of the photosensitive area 1. Thus, a photosensitive area having 500 grids $G_0$ and for which $T_1=T_2$ can tolerate over-illumination B of approximately 1000.

To improve the resistance of the device to over-illumination it is advantageous to increase the duration of stage $T_2$ compared with that of stage $T_1$.

Stage $T_2$ is limited by the time necessary for carrying out the transfer of signal charges $Q_S$ along each connection $C_i$ to the memory. It has been seen that the transfer takes place across the equivalent of a saturated MOS transistor.

If the capacitance of connection $C_i$ is called $c_i$, the residual charge $Q_r$ beneath the reading diodes $D_1$ connected by $C_i$ is expressed:

$$Q_r = \frac{Q_S}{1 + B\frac{Q_S}{c_i^2}T}, \text{ with } B = \frac{W}{L}\cdot \mu \cdot C_{Ox}$$

in which $C_{Ox}$ is the capacity of grid $G_2$ per surface area, W the grid width, L its length and $\mu$ the mobility of the minority carriers of the substrate. Thus, for reducing the residual charge it is advantageous to reduce the capacity $c_i$.

It would also appear that the low value signal charges $Q_S$ are transmitted less well than the high value charges. Thus, the sensitivity of the device is lower for low light levels.

It is possible for significantly improve the transfer of small quantities of signal charges $Q_S$ by superimposing a fixed charge $Q_O$ thereon, which is obtained by increasing by $\Delta V$ the potential of grid $G_2$ at time $t_4$. In this case the transfer charge is written:

$$Q_S + Q_O \text{ with } Q_O = c_i \cdot \Delta V.$$

At the output of the read register $R_2$ a signal superimposed on the fixed charge $Q_O$ is obtained, which also facilitates the transfer of charges into the register.

In certain cases this process can have the disadvantage of adding to the signal a noise due to the variations of the capacity $c_i$ from one connection $C_i$ to the other, leading to variations in the quantity $Q_O$ introduced from one column to the other.

Figure 5:
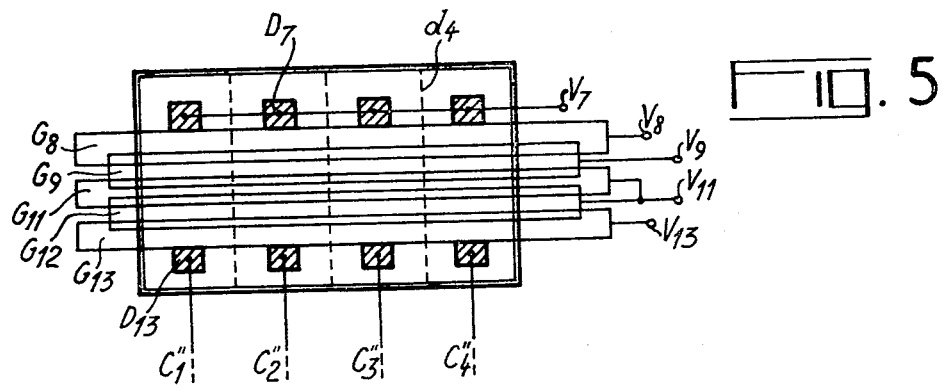
FIG. 5 a diagrammatic plan view of an embodiment of a device for injecting a supplementary quantity of charges $Q_0$ into the photosensitive device according to the invention.
Figure 6:
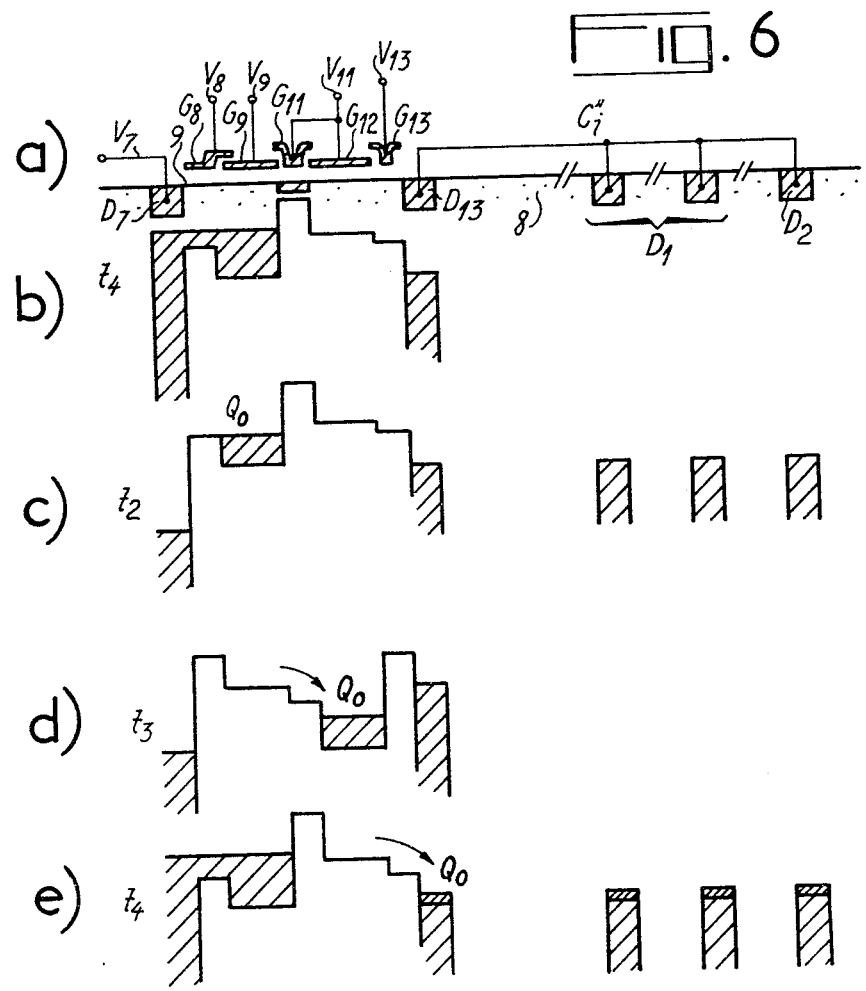
FIG. 6a a sectional view of the device in FIG. 5 and FIGS. 6b to 6e diagrams illustrating the operation of this device.

FIGS. 5 and 6a are a diagrammatic plan view and a longitudinal sectional view of an embodiment of a device for injecting a quantity of supplementary charges $Q_O$ into the photosensitive device according to the invention. With this device the quantities of injected charges $Q_O$ are identical for all points of the photosensitive area and independent of the values of capacities $c_i$ of connections $C_i$.

This device is constituted by the integration on to a semiconductor substrate (which can be the same as that on to which is integrated the remainder of the photosensitive device) of a number of diodes $D_7$ which is the same as the number of connections $C_i$. Four diodes $D_7$ are shown in FIG. 5 and are raised to a variable potential $V_7$. Two copolanar grids $G_8$ and $G_9$ follow said diodes and are raised to two constant potentials $V_8$, $V_9$ with $V_8$ being lower than $V_9$. Thus, the passage of diodes $D_7$ from a low level to a high level makes it possible to store a quantity of charges $Q_O$ beneath $G_9$ such that:

$Q_O=(V_9-V_8)\cdot C_{G9}$, in which $C_{G9}$ represents the storage capacity beneath the grid $G_9$.

Thus, the quantity of charges $Q_O$ stored beneath $G_9$ is independent of the threshold voltage variations beneath $G_8$ and $G_9$ from one photosensitive point to the other and only depends on the geometry of $G_9$ and its variation from one end to the other of the device can be reduced to a low level.

Vertical isolating diffusions $d_4$ delimit in per se known manner the area of the substrate reserved for the processing of charges from a single diode $D_7$.

FIGS. 6b to 6e are diagrams illustrating the operation of the device shown in FIG. 5 and 6a at times $t_4$, $t_2$, $t_3$ and again at $t_4$. These drawings only show the interface 9 of substrate 8 and the insulating layer covering them.

FIGS. 6b and 6c show the storage of the quantity of charges $Q_O$ beneath grid $G_9$. Grid $G_9$ is followed by a grid $G_{11}$ and a storage electrode $G_{12}$, which are raised to a variable potential $V_{11}$. At time $t_3$ each quantity of charges $Q_O$ is transferred from $G_9$ to beneath $G_{12}$. Grid $G_{12}$ is followed by a screen grid $G_{13}$ raised to a constant potential $V_{13}$. Following grid $G_{13}$ there are four diodes $D_{13}$ connected by metallic connections $C''1$ to $C''4$ to diodes $D_1$ and $D_2$, i.e. to connections $C_1$ to $C_4$.

At time $t_4$ potential $V_{11}$ passes to zero and leads to the transfer of each quantity of charges $Q_O$ to beneath diodes $D_{13}$, $D_1$ and $D_2$, which are connected in parallel. Thus, charge $Q_O$ is introduced at the same time $t_4$ as the signal charge $Q_S$ from the read line. The generation of $Q_O$ takes place on reading each line of photosensitive elements.

The geometry of the memory and the read register must be such that it is possible to store the total charge equal to $Q_O+Q$, in which Q is the maximum signal charge with respect to a photosensitive point.

Instead of the device shown in FIG. 5, a C.C.D. shift register, with parallel outputs, could also be used. Each of the parallel outputs of this register is connected by metal connections to one of the pairs of diodes $D_1-D_2$, i.e. to one of the connections $C_1$ to $C_4$. During the reading time of a line from $t_1$ to $t_5-\tau-$ this register is addressed by the same control signals as the read register $R_2$. A charge $Q_o$ is injected permanently at the input, so at the beginning from the line return time, $t_5-\tau-$ the charge $Q_o$ is available at each stage of the register. This charge is the same for all the stages because it was generated by a single input stage and because the transfer inefficiency has a negligible effect on a constant signal. It is only the charge recombined in the substrate which introduces a dispersion but its value is generally very low.

When there is transfer of the signal-charge $Q_S$ of the read line from diodes $D_1$ to diodes $D_2$ by the connections $C_1$ to $C_4$, at the same time, the C.C.D. register is laterally emptied. The charge $Q_o$ is so superimposed to the signal for all the columns. It is the sum of charges $Q_o+Q_S$ which is transferred in the reading register.

The transfer of charges in the C.C.D. shift register, with parallel outputs, which is used could be realized in surface or in bulk channels. The transfer in surface channel allows to transfer a more important charge $Q_o$ for the same surface.

As shown in FIG. 5, this injection device allows to inject charge quantities $Q_o$ identical for all the points of the photosensitive zone and independent from the values of the capacities $c_i$ of the connections $C_i$. The C.C.D. shift register is generally integrated on the same semiconductor substrate as the remainder of the photosensitive device.

Another embodiment of the memory, the parasitic charge removal device and the read register of the photosensitive device according to the invention will now be described, these parts being designated 2 and 3 in FIG. 1.

In this embodiment it was desired to transfer signal charges from the memory to the read register $R_2$ without using diodes like diodes $D_4$ and $D_6$ which are connected pairwise by metal connections outside substrate $C'_1$ to $C'_4$.

Thus, this embodiment has the advantage compared with that shown in FIG. 1 of eliminating interference liable to be introduced by a variable coupling of two photosensitive points between on the one hand each diode $D_4$ or $D_6$ and the adjacent grid $G_4$ or $G_6$ and on the other hand between each pair of diodes $D_4$ and $D_6$ (connection $C'_1$).

In this embodiment it was also desired to obtain a better uniformity of width l of grid $G_2$ raised to constant potential $V_2$ and which follows diodes $D_2$. It was also desirable to make same width l smaller.

Thus, this embodiment has the advantage of eliminating interference liable to be introduced by a variable penetration between individual photosensitive points of diodes $D_2$ beneath grid $G_2$. This variable penetration can lead to variable transfer times of the signal charges from each diode $D_2$ to the memory, due to the variable width of the grid of the equivalent MOS transistor across which the charges are transferred into the memory. Moreover, this embodiment has the advantage of increasing the speed of signal charge transfer from $D_1$ and $D_2$ into the memory, due to the reduction in width of $G_2$.

Finally this embodiment has the advantage of simplifying the control signals.

However, this embodiment imposes somewhat more severe manufacturing constraints as regards to the dimensions of the various components.

Figure 7:
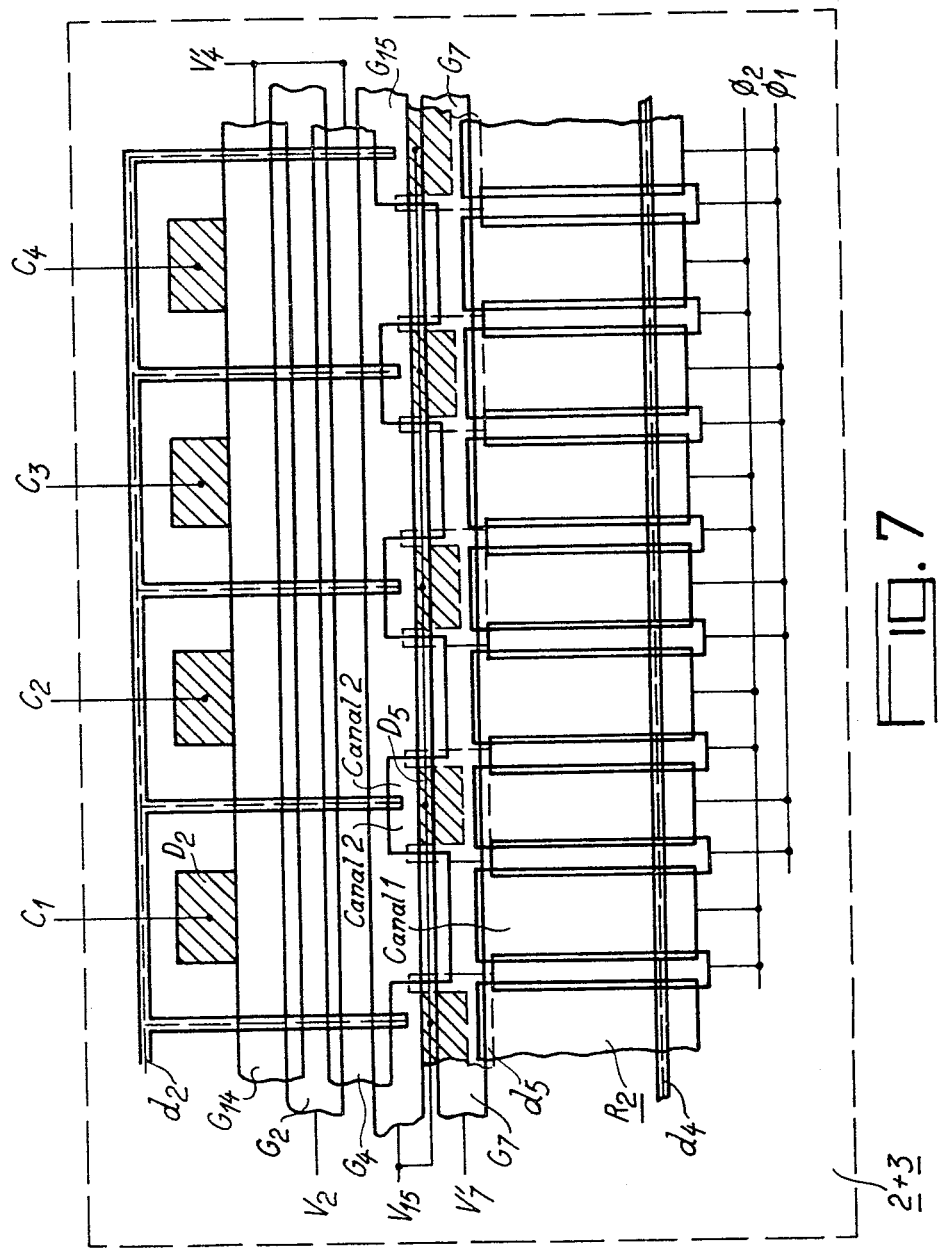
FIG. 7 a diagrammatic plan view of another embodiment of the memory, the parasitic charge removal device and the read register of the photosensitive device according to the invention.

FIG. 7 is a diagrammatic plan view of this embodiment.

FIGS. 8 and 9a are cross-sectional views of the embodiment of FIG. 7.

Grid $G_2$ raised to constant potential $V_2$ is positioned after diodes $D_2$ connected by connnections $C_1$ to $C_4$ to reading diodes $D_1$. Grid $G_2$ is surrounded by two coplanar grids $G_{14}$ and $G_4$, maintained at a constant potential $V'_4$ higher than $V_2$. Thus, the width l of grid $G_2$ is determined in a single photogravure operation by the gap between the grids $G_{14}$ and $G_4$. Thus, a much better uniformity of width l is obtained and the width can also be greatly reduced.

Grid $G_4$, like grids $G_O$ in FIG. 3 is a rectangular grid having rectangular slots.

FIG. 8a is a cross-sectional view of the embodiment of FIG. 7 in a smaller width area of $G_4$, i.e. level with a slot.

FIG. 9a, is a cross-sectional view of the embodiment of FIG. 7 in the gap between two notches. There is a removal diode $D_5$ in each substrate portion placed beneath a notch of $G_4$.

A U-shaped isolating diffusion area $a_5$ surrounds each diode $D_5$. This area determines two channels on each part of substrate 4 reserved by the diffusion zone $d_2$ for the processing of charges for one of the connections $C_1$ to $C_m$. They consist of channel 1 (FIG. 9a) leading to the read register $R_2$, said access being regulated by a grid $G_7$ raised to a variable potential $V'_7$ and which is positioned astride between the end of $G_4$ and the start of $R_2$. The other channel 2 (FIG. 8a), which leads to the removal diode $D_5$, the latter then being common to two adjacent memory points for space-saving reasons.

Every other diode $D_5$ may be deleted. It allows either to have an horizontal pitch more reduced or to increase the storage capacity of the memory of line.

In this case, every other of the vertical parts of the diffusion zone $d_2$, i.e. the vertical parts which are not followed by a diode $D_5$, are prolonged and arrive to a storage electrode which doesn't receive charges.

The access to diode $D_5$ is then regulated by a rectangular electrode $G_{15}$ raised to a variable potential $V_{15}$. This electrode is astride the horizontal part of the notches of $G_4$. It is separated from $G_4$ by a not shown oxide layer. Potential $V_{15}$ is also applied to diodes $D_5$.

FIGS. 8a and 9a are cross-sectional views along channels 2 and 1.

The operation of this embodiment will now be studied with reference to FIGS. 8b, 8c and 9b, 9c representing the development of the surface potential in the semiconductor substrate 4a at different times $t'_1$, $t'_2$, $t'_3$. These times are marked on FIGS. 10a to 10d, which show the control signals liable to be applied in this embodiment.

In FIGS. 10c and 10d it is possible to see signals $L_i$ and $L_{i+1}$, already shown in FIGS. 4e and 4f. Signals $V_{15}$ and $V_{17}$ are shown in FIGS. 10a and 10b, being periodic of period T and vary between a low level and a high level. Signal $V_{15}$ is at high level when signals $L_i$, $L_{i+1}$ ... and signal $V'_7$ are at low level.

Signals $L_i$, $L_{i+1}$ ... pass to high level a moment $\tau$ after $V_{15}$ has passed to low level. Signal $V'_7$ passes to high level a moment $\tau$ after the passage of $L_i$, $L_{i+1}$ ... to low level. Finally signal $V'_7$ returns to low level a moment $\tau$ before the passage of $V_{15}$ to high level.

Stage $T_1$ takes place as from the time when $V_{15}$ is at high level up to the time when $L_i$, $L_{i+1}$ ... pass to high level. Stage $T_2$ takes place throughout the remainder of period T. Stages $T_1$ and $T_2$ will now be examined.

Stage $T_1$

At time $t'_1$ only signal $V_{15}$ is at high level.

FIG. 8b shows the surface potentials at this time.

The parasitic charges of all the photosensitive points are removed from diodes $D_1$ to diodes $D_2$, then beneath grid $G_4$ and finally beneath a removal diode $D_5$. Transfer takes place at constant potential $V_2 - V_T$ as a result of grid $G_2$.

Stage $T_2$

At time $t'_2$ only signal $L_i$ is at high level. FIGS. 8c and 9b show the surface potentials in the substrate at this time. The signal charges of line $L_i$ are then transferred from diodes $D_1$ to diodes $D_2$, then stored beneath grid $G_4$ which serves as a memory.

At time $t'_3$ only signal $V'_7$ is at high level.

FIG. 9c shows the surface potential in the substrate at this time. There is then a transfer of signal charges from line $L_i$ where they are stored below $G_4$ to beneath the read register $R_2$.

A new stage $T_1$ then starts, whilst line $L_i$ is read by register $R_2$.

If read register $R_2$ is a register where there is a volume transfer of the charges, beneath the electrodes of the register there is a diffused area z which can stop in the centre of grid $G_7$. In this case the potential beneath register $R_2$ is higher than beneath $G_4$, which facilitates charge transfer.

Superimposing a fixed charge $Q_o$ on signal charges $Q_S$ can take place in the two ways indicated hereinbefore, i.e by increasing the potential of $G_2$ at time $t'_2$ by $\Delta V$ or by using the device of FIGS. 5 and 6a to 6e. In this case the stage represented in FIG. 6e takes place at time t'hd 2.

It is obvious that the present invention generally relates to a photosensitive device integrated on to a silicon semiconductor substrate. It is also possible to integrate on to a silicon substrate photosensitive detectors made from some other material.

The device according to the invention is also able to operate, whilst giving results as good as those obtained by the device described in the I.E.E.E. article by transferring the signal charges as they arrive in the read register $R_2$, without storing them in the memory.

Finally the device according to the invention is preferably a CCD device, where there is a surface or volume charge transfer.

What is claimed is:

1. A photosensitive device read by charge transfer, wherein it has
    n lines of m photosensitive points, each photosensitive point being constituted by the integration of a semiconductor substrate of an MOS capacitor ($C_O$), having a grid $G_0$ common to the points of the same line and a reading diode $D_1$ separated from grid $G_0$ by a screen grid $G_1$ raised to a constant potential ($V_1$), m metallic connections ($C_1 \ldots C_m$) connecting in parallel n diodes belonging to different lines;
    m diodes $D_2$ integrated on to the same semiconductor substrate to which lead the m metallic connections, said diodes being followed by a grid $G_2$ raised to a constant potential ($V_2$);
    removing means on a diode ($D_5$) of the charges accumulated on diodes $D_1$ and $D_2$ during each time interval when none of the grids $G_0$ is at zero;
    at least one shift register ($R_1$) making it possible to periodically zero each grid $G_0$ and remove the signal charges on diodes $D_1$, and diodes $D_2$;
    means ensuring the transfer of the signal charges arriving beneath diodes $D_2$ to a charge transfer read register ($R_2$) with m parallel inputs and a series output.

2. A device according to claim 1, wherein it has a memory integrated on to the semiconductor substrate following diodes $D_2$ and beneath which the signal charges are collected before being transferred into the read register ($R_2$).

3. A device according to claim 2, wherein the memory is constituted by m diodes ($D_4$) followed by a grid ($G_4$) common to the m diodes and raised to a variable potential ($V_4$).

4. A device according to claim 3, wherein it has integrated on to the substrate following the memory, a grid $G_5$ and a diode $D_5$ connected to a variable potential ($V_5$), said diode receiving the parasitic charges accumulated beneath diodes $D_1$ and $D_2$ during the time interval when no photosensitive grid $G_0$ was at zero.

5. A device according to claim 4, wherein it has integrated on to the semiconductor substrate (4) m diodes $D_6$ followed by a single grid $G_6$; each of these diodes being connected by a metallic connection ($C'_1 \ldots C'_m$) to the corresponding diode ($D_4$) of the memory and grid $G_6$ raised to the same variable potential ($V_4$) as grid ($G_4$) of the memory, a single grid $G_7$ raised to a variable potential ($V_7$) and the charge transfer read register ($R_2$), whose preceding grid $G_7$ permits the charging to take place after the signal charges resulting from the reading of a line have been collected by the memory.

6. A device according to claim 5, wherein an oxide layer and an aluminium layer cover the diodes ($D_4$) of the memory and diodes $D_6$, as well as part of adjacent grids ($G_4$ and $G_6$), an electrical contact being established across the insulant level with each grid.

7. A device according to claim 2, wherein a grid ($G_3$) raised to a variable potential ($V_3$) is intercalated between grid $G_2$ raised to a constant potential ($V_2$) and the memory on the semiconductor substrate.

8. A device according to claim 2, wherein the grid $G_2$ is surrounded by two coplanar grids raised to a constant potential below $V_2$, one of these grids ($G_{14}$) being adjacent to diodes $D_2$ and the other grid $G_4$ constituting the memory.

9. A device according to claim 8, wherein grid $G_4$ is a rectangular grid having rectangular notches, at least every other of each part of the substrate (4) placed beneath a notch has a charge removal diode ($D_5$), a U-shaped isolating diffusion area surrounds each charge removal diode ($D_5$) and definies two channels on that part of the substrate reserved for the processing of charges from one of the metallic connections ($C_1 \ldots C_m$), one of the channels (channel 2) leading to a removal diode ($D_5$) permits the removal of parasitic charges accumulated beneath diodes $D_1$ and $D_2$ to below diode $D_5$ during the time interval when none of the photosensitive grids $G_0$ is at zero, said transfer being controlled by a grid ($G_{15}$) positioned astride the horizontal part of the notches of $G_4$, whilst the other channel (channel 1) makes it possible to transfer the signal charges from a line stored beneath grid $G_4$ into the charge transfer read register ($R_2$), said transfer being controlled by a grid ($G_7$) positioned astride the end of $G_4$ and the start of the register.

10. A device according to claim 2, wherein the constant potential ($V_2$) applied to grid $G_2$ following diodes $D_2$ is increased by a constant quantity $\Delta V$ during the transfer of signal charges beneath the memory.

11. A device according to claim 2, wherein it has, integrated on to the same semiconductor substrate m diodes ($D_7$) raised to a variable potential ($V_7$) followed by two coplanar grids $G_8$ and $G_9$ raised to two constant potentials $V_8$ and $V_9$, with $V_8$ lower than ($V_9$) in such a way that a quantity of constant charges ($Q_0$) is stored beneath $G_9$ during the passage of the potential applied to the diode from low level to high level, a grid ($G_{11}$) and a storage electrode ($G_{12}$) raised to a variable potential ($V_{11}$), a screen grid ($G_{13}$) raised to a constant potential ($V_{13}$) and m diodes $D_{13}$ connected by metallic connections ($C''_1 \ldots C''_m$) to m diodes $D_2$, the quantity of charges ($Q_0$) being transferred beneath each diode $D_{13}$ during the transfer of signal charges beneath the memory.

12. A device according to claim 2, wherein it comprises, integrated on the same substrate, a C.C.D. shift register comprising m parallel outputs, each output being connected by a metal connection to one of the pairs of diodes $D_1$-$D_2$, this register receiving during the reading time of a line the same control signal as the read register ($R_2$) and a constant charge ($Q_o$) being injected permanently at the input and the register being emptied, when there is transfer of the signal-charges of the read line from the diodes $D_1$ to the diodes $D_2$.

13. A device according to claim 1, wherein each photosensitive point has in the vicinity of the grid $G_0$ a collecting area ($D_{10}$) which is sensitive to the limited wavelengths to which $G_0$ is not sensitive, the charges created by the radiation on said areas ($D_{10}$) being collected beneath the grids $G_0$.

14. A device according to claim 13, wherein each collecting area ($D_{10}$) is constituted by a single thin oxide area.

15. A device according to claim 13, wherein each collecting area ($D_{10}$) is constituted by a diode.

16. A device according to claim 15, wherein the diffusion zone corresponding to each diode constituting a collecting area ($D_{10}$) is extending under the adjacent grid $G_o$.

17. A device according to claim 1, wherein that part of the semiconductor substrate (4) carrying the photosensitive area (1) has a reduced thickness and is illuminated by its rear face.

18. A device according to claim 1, wherein that part of the semiconductor substrate (4) which carries the photosensitive area (1) is illuminated by its front face and wherein the grids ($G_0$) are photosensitive and the reading diodes ($D_1$) are completely covered with aluminium.

19. A device according to claim 1, wherein the reading diodes ($D_1$) are arranged in staggered manner and are positioned in rectangular notches made on the horizontal grids $G_0$.

20. A device according to claim 19, wherein it has m vertical grids $G_1$ raised to potential $V_1$ partly covering on the one hand one of the vertical edges of each notch made on each grid $G_0$ and on the other hand each reading diode $D_1$ arranged in alternating manner from one line to the next to the right and left of the vertical electrode $G_1$.

21. A device according to claim 20, wherein the m vertical grids $G_1$ are covered with an insulating layer on which are deposited the m metallic connections ($C_1$ to $C_m$) which, as a result of contacts through the insulating layer, connect in parallel n reading diodes $D_1$ belonging to n different grids $G_0$.

22. A device according to claim 1, wherein the reading diodes $D_1$ and the diodes $D_2$ are arranged in matrix form.

23. A device according to claim 1, wherein it has two shift registers, one of which addresses the lines of the even row and the other the lines of the uneven row.

24. A device according to claim 1, wherein each grid $G_0$ is connected to one of the electrodes of an MOS transistor ($T_{01} \ldots T_{0n}$), whose grid is connected to a shift register ($R_1$) and whose other electrodes is connected to earth, the shift register periodically making each transistor conductive and zeroing each grid $G_0$.

25. A device according to claim 1, wherein each grid $G_0$ is connected to one of the electrodes of an MOS transistor ($T_1 \ldots T_n$), whose other electrode is connected to a constant potential ($V_9$) and whose grid receives a variable potential ($V_8$), which makes the conductors conductive and brings the grids $G_O$ to constant potential ($V_9$) after the transfer of signal charges from one line into the charge transfer register ($R_2$) has taken place.

26. A device according to claim 1, wherein each grid $G_0$ is connected to one of the electrodes of an MOS transistor ($T_1 \ldots T_n$), whose other electrode is connected to a constant potential ($V_9$) and whose grid receives a constant potential, said transistors ensuring the restoration, after a time constant, of the constant potential ($V_9$) beneath the grids $G_0$ after the transfer of signal charges from one line into the charge transfer register ($R_2$) has taken place.

27. A device according to claim 1, wherein the semiconductor substrate used is made from silicon.

28. A charge transfer photosensitive read device comprising n lines of m photosensitive points, each photosensitive point being constituted by the integration on a semiconductor substrate of a MOS capacitor ($C_0$), having a grid $G_0$ common to the points of the same line and a reading diode $D_1$ separated from grid $G_0$ by a screen grid $G_1$ raised to a constant potential ($V_1$), m metallic connections ($C_1 \ldots C_m$) connecting in parallel n diodes belonging to different lines;

m diodes $D_2$ integrated on to the same semiconductor substrate to which lead the m metallic connections, said diodes being followed by a grid $G_2$ raised to a constant potential ($V_2$);

removing means on a diode ($D_5$) of the charges accumulated on diodes $D_1$ and $D_2$ during each time interval when none of the grids $G_0$ is at zero;

at least one shift register ($R_1$) making it possible to periodically zero each grid $G_0$ and remove the signal charges on diodes $D_1$, and diodes $D_2$;

means ensuring the transfer of the signal charges arriving beneath diodes $D_2$ to a charge transfer read register ($R_2$) with m parallel inputs and a series output;

a memory integrated on to the semiconductor substrate following diodes $D_2$ and beneath which the signal charges are collected before being transferred into the read register ($R_2$).

29. A charge transfer photosensitive read device comprising n lines of m photosensitive points, each photosensitive point being constituted by the integration on a semiconductor substrate of a MOS capacitor ($C_0$), having a grid $G_0$ common to the points of the same line and a reading diode $D_1$ separated from grid $G_0$ by a screen grid $G_1$ raised to a constant potential ($V_1$), the reading diodes ($D_1$) being arranged in staggered manner and positioned in rectangular notches made on the horizontal grids $G_0$, m vertical grids $G_1$ raised to potential $V_1$ partly covering on the one hand one of the vertical edges of each notch made on each grid $G_0$ and on the other hand each reading diode $D_1$ arranged in alternating manner from one line to the next to the right and left of the vertical electrode $G_1$ and the m vertical grids $G_1$ being covered with an insulating layer on which are deposited the m metallic connections ($C_1$ to $C_m$) which, as a result of contacts through the insulating layer, connect in parallel n reading diodes $D_1$ belonging to n different grids $G_0$.

m diodes $D_2$ integrated on to the same semiconductor substrate to which lead the m metallic connections, said diodes being followed by a grid $G_2$ raised to a constant potential ($V_2$);

removing means on a diode ($D_5$) of the charges accumulated on diodes $D_1$ and $D_2$ during each time interval when none of the grids $G_0$ is at zero;

at least one shift register ($R_1$) making it possible to periodically zero each grid $G_0$ and remove the signal charges on diodes $D_1$, and diodes $D_2$;

means ensuring the transfer of the signal charges arriving beneath diodes $D_2$ to a charge transfer read register ($R_2$) with m parallel inputs and a series output.

30. A charge transfer photosensitive read device comprising n lines of m photosensitive points, each photosensitive point being constituted by the integration on a semiconductor substrate of a MOS capacitor ($C_0$), having a grid $G_0$ common to the points of the same line and a reading diode $D_1$ separated from grid $G_0$ by a screen grid $G_1$ raised to a constant potential ($V_1$), m metallic connections ($C_1 \ldots C_m$) connecting in parallel n diodes belonging to different lines;

m diodes $D_2$ integrated on to the same semiconductor substrate to which lead the m metallic connections, said diodes being followed by a grid $G_2$ raised to a constant potential ($V_2$);

removing means on a diode ($D_5$) of the charges accumulated on diodes $D_1$ and $D_2$ during each time interval when none of the grids $G_0$ is at zero;

at least one shift register ($R_1$) making it possible to periodically zero each grid $G_0$ and remove the signal charges on diodes $D_1$, and diodes $D_2$;

means ensuring the transfer of the signal charges arriving beneath diodes $D_2$ to a charge transfer read register ($R_2$) with m parallel inputs and a series output;

a memory integrated on to the semiconductor substrate following diodes $D_2$ and beneath which the signal charges are collected before being transferred into the read register ($R_2$), the grid $G_2$ being surrounded by two coplanar grids raised to a constant potential below $V_2$, one of these grids ($G_{14}$) being adjacent to diodes $D_2$ and the other grid $G_4$ constituting the memory, said grid $G_4$ being a rectangular grid having rectangular notches, at least every other of each part of the substrate (4) placed beneath a notch has a charge removal diode ($D_5$), a U-shaped isolating diffusion area surrounds each charge removal diode ($D_5$) and definies two channels on that part of the substrate reserved for the processing of charges from one of the metallic connections ($C_1 \ldots C_m$), one of the channels (channels 2) leading to a removal diode ($D_5$) permits the removal of parasitic charges accumulated beneath diodes $D_1$ and $D_2$ to below diode $D_5$ during the time interval when none of the photosensitive grids $G_0$ is at zero, said transfer being controlled by a grid ($G_{15}$) positioned astride the horizontal part of the notches of $G_4$, whilst the other channel (channel 1) makes it possible to transfer the signal charges from a line stored beneath grid $G_4$ into the charge transfer read register ($R_2$), said transfer being controlled by a grid ($G_7$) positioned astride the end of $G_4$ and the start of the register.

31. A charge transfer photosensitive read device comprising n lines of m photosensitive points, each photosensitive point being constituted by the integration on a semiconductor substrate of a MOS capacitor ($C_0$), having a grid $G_0$ common to the points of the same line and a reading diode $D_1$ separated from grid $G_0$ by a screen grid $G_1$ raised to a constant potential ($V_1$), m metallic connections ($C_1 \ldots C_m$) connecting in parallel n diodes belonging to different lines, each photosensitive point having in the vicinity of the grid $G_0$ a collecting area ($D_{10}$) which is sensitive to the limited wavelengths to which $G_0$ is not sensitive, the charges created by the radiation on said areas ($D_{10}$) being collected beneath the grids $G_0$.

m diodes $D_2$ integrated on to the same semiconductor substrate to which lead the m metallic connections, said diodes being followed by a grid $G_2$ raised to a constant potential $(V_2)$;

removing means on a diode $(D_5)$ of the charges accumulated on diodes $D_1$ and $D_2$ during each time interval when none of the grids $G_0$ is at zero;

at least one shift register $(R_1)$ making it possible to periodically zero each grid $G_0$ and remove the signal charges on diodes $D_1$, and diodes $D_2$;

means ensuring the transfer of the signal charges arriving beneath diodes $D_2$ to a charges transfer read register $(R_2)$ with m parallel inputs and a series output.

32. A device according to claim 31, wherein it has a memory integrated on to the semiconductor substrate following diodes $D_2$ and beneath which the signal charges are collected before being transferred into the read register $(R_2)$.

33. A device according to claim 31, wherein each collecting area $(D_{10})$ is constituted by a single thin oxide area.

34. A device according to claim 31, wherein each collecting area $(D_{10})$ is constituted by a diode.

35. A device according to claim 31, wherein the diffusion zone corresponding to each diode constituting a collecting area $(D_{10})$ is extending under the adjacent grid $G_0$.

* * * * *